United States Patent [19]

Liles

[11] Patent Number: 4,688,062
[45] Date of Patent: Aug. 18, 1987

[54] SEMICONDUCTOR STRUCTURE AND METHOD OF MANUFACTURE

[75] Inventor: Barry J. Liles, Westboro, Mass.

[73] Assignee: Raytheon Company, Lexington, Mass.

[21] Appl. No.: 833,677

[22] Filed: Feb. 25, 1986

Related U.S. Application Data

[63] Continuation of Ser. No. 626,514, Jun. 29, 1984.

[51] Int. Cl.$^4$ ............... H01L 29/80; H01L 27/02; H01L 29/12; H01L 29/36
[52] U.S. Cl. .................................. 357/22; 357/47; 357/61
[58] Field of Search ..................... 357/22, 47, 61

[56] References Cited

U.S. PATENT DOCUMENTS 3,657,615  4/1972  Driver ................................. 357/22
3,942,186  3/1976  McAvoy et al. ................... 357/22
4,196,439  4/1980  Niehaus et al. .................... 357/22

FOREIGN PATENT DOCUMENTS 1507091  4/1978  United Kingdom .

OTHER PUBLICATIONS

Webster's New World Dictionary, Second College Edition, Copyright 1978, p. 1102.

Primary Examiner—Andrew J. James
Assistant Examiner—Jerome Jackson
Attorney, Agent, or Firm—Denis G. Maloney; Richard M. Sharkansky

[57] ABSTRACT

A field effect transistor includes a semi-insulating substrate having a doped compensated buffer layer. Such compensated buffer layer is doped with a species which provides deep level acceptors to compensate for background donor doping of the buffer layer and to thus provide the semi-insulating buffer layer. The compensated buffer layer is used to isolate subsequent layers from crystal defects in the substrate. A thin shielding layer having a dopant concentration of $10^{14}$–$3 \times 10^{15}$ atoms/cm$^3$ and a dopant conductivity opposite to that of the dopant used to compensate the buffer layer is disposed over the buffer layer. An active layer is then disposed over the shielding layer and areas in the active layer are provided for source, drain, and gate electrodes. By providing the doped shielding layer, a small amount of conduction is provided in the shielding layer which prevents the build-up of charge in the buffer layer caused by ionization of the deep-level acceptor. The shielding layer also prevents the out-diffusion of the dopant species of the buffer layer into the active layer of the device.

5 Claims, 2 Drawing Figures

SEMICONDUCTOR STRUCTURE AND METHOD OF MANUFACTURE

This application is a continuation of application Ser. No. 626,514, filed June 29, 1984.

BACKGROUND OF THE INVENTION

This invention relates generally to semiconductor devices and manufacturing methods, and more particularly to field effect transistors.

As is known in the art, a field effect transistor is often employed to amplify radio frequency power by feeding a radio frequency (RF) voltage signal to a gate electrode thereof for controlling the conductivity of a drain source channel underlying the gate electrode. As is also known in the art, such field effect transistors are often fabricated on semi-insulating crystal substrates of a Group III-V semiconductor material system with gallium arsenide (GaAs) being a common example of one of such material systems. Generally, the crystal substrate is provided with a epitaxially grown semiconductor crystal layer. This epitaxial crystalline layers provide the active regions of the field effect transistor. Radio frequency performance from a field effect transistor is dependent upon the crystalline quality of the semi-insulating substrate end of the epitaxial semiconductor layers used to form the field effect transistor.

Several methods are known for producing crystalline semi-insulating gallium arsenide substrates. One of the most commonly used of such methods is the so-called Horizontal Bridgman technique. This technique generally requires the doping of the substrate with a heavy metal, such as chromium, to compensate for the normal background donor doping of the substrate material to neutralize the donor doping of the substrate and to thus increase the resistivity of the substrate. One problem with chromium doping is that the chromium tends to out-diffuse from the substrate and into the active regions of the transistor formed on the substrate. This outdiffusion of chromium results in a decrease in electron mobility in the so-called drain source channel of the field effect transistor and concomitant therewith degrades the device performance. A second problem is that chromium has an acceptor energy level which is intermediate the so-called valance band and conduction band of the GaAs substrate crystal. At high operation frequencies of the field effect transistor, the rate of recombination of holes and electrons between the valance band of the crystal and the intermediate level of the chromium is lower than the rate of change of an injected current flux in the conduction band resulting in a net fixed negative charge in the substrate. The presence of this negative charge in the substrate repels electrons in the channel region of the device resulting in a loss of gain and loss of device power at those frequencies.

Other methods are also known for growing GaAs substrates. Generally these methods to date, do not provide high quality substrates upon which may be formed active layers for high quality field effect transistors.

One general problem with these methods however, is that in growing substrates of gallium arsenide, for example, interstitial dislocations, and vacancies of gallium or arsenic occur which create electron or hole traps in the crystal that may adversely affect the performance of a field effect transistor fabricated directly thereon. Thus, the crystalline quality of the gallium arsenide substrates is in general relatively poor for fabricating directly thereon, high quality, high frequency field effect transistors.

Another solution in the art to improve the performance of field effect transistors is to provide a semi-insulating epitaxially grown buffer layer over the semi-insulating substrate prior to epitaxial growth of the active layers of the field effect transistor. This buffer layer isolates the active layer of the transistor from the electron or hole traps provided by the substrate due to poor crystal quality. One method generally used in the art to provide such buffer layers is to again use a heavy metal, such as chromium, as a dopant during epitaxial growth. Chromium when used as a dopant provides in the buffer layer the so-called deep acceptor levels mentioned above. The presence of such deep acceptor levels in the buffer layer is generally used to compensate for the normal donor background doping levels encountered during growth of the buffer layer. Thus, a deep level acceptor is used to compensate the buffer layer, as in the case of compensating the substrate, to neutralize the effects of background donor doping in the buffer layer and thus to provide a semi-insulating relatively high resistivity buffer layer. The donor background levels originate from contamination caused by the reaction vessels used to grow the epitaxial layers. As with growing substrates with chromium dopants, a problem with such chromium doping in buffer layers is that in the presence of an RF field some of these deep-acceptor levels will ionize, particularly in substrates which are over-compensated with chromium dopant. Ionization of deep level acceptor states in such a structure produces the layer of negative charge in the buffer layer which will tend to partially deplete the active region underlying the gate electrode. This arrangement, as is the case where chromium doping is used to compensate GaAs substrates, reduces $I_{DSS}$, the quiescent drain to source current as well as increases the parasitic resistance associated with the drain-source channel by repelling electrons in the drain-source channel. These effects provide a reduction in both gain and output power particularly at high frequencies. Further, as mentioned above, the chromium is believed to out-diffuse also from the buffer layer and into the active layer resulting in the decrease in electron mobility and loss of power as with out-diffusion from the substrate.

Therefore, while the use of a buffer layer adequately isolates the active regions of the transistor from the effects caused by crystal defects in the substrate, the buffer layer, by being compensated with chromium, does not provide an adequate solution to the out-diffusion and negative charge layer problems.

SUMMARY OF THE INVENTION

In accordance with the present invention, a field effect transistor includes a semi-insulating substrate having a doped compensated buffer layer. Such compensated buffer layer is doped with a species which provides deep level states to compensate for normal background doping of the buffer layer and to thus provide a semi-insulating buffer layer. The compensated buffer layer is used to isolate subsequent layers from crystal defects in the substrate. A thin shielding layer, having a predetermined doping concentration and a dopant conductivity opposite to the conductivity of the dopant species used to compensate the buffer layer, is disposed over the buffer layer. An active layer is then disposed over this shielding layer and areas in the active layer are provided for source, drain and gate electrodes. With such an arrangement, the shielding layer shields the active layer of the field effect transistor from the ionization of the deep level states of the compensated buffer layer. A small amount of DC and rf conduction is provided in this shielding layer due to the predetermined doping concentration. This conduction prevents the build up of an excess layer of charge generally provided by the ionization of the species used to compensate the buffer layer and thus eliminates the loss in radio frequency gain and output power generally associated with such build up of charge.

In accordance with a preferred embodiment of the invention, the field effect transistor includes a semiinsulating substrate of a group III–V material, and disposed on said substrate is a epitaxially grown buffer layer. Said substrate and buffer layers are each doped with a heavy metal, such as chromium, which provides deep level acceptor states in the substrate and buffer to compensate for the normal background donor doping of the substrate and buffer, thus providing the substrate and buffer with a high resistivity. An epitaxially grown shielding layer having an electron density in the range of $10^{14} - 3 \times 10^{15}$ electrons/cm$^3$ is provided over the buffer layer. An active layer is then disposed over the shielding layer, and drain, source and gate electrodes are provided on the active layer. With such an arrangement, the shielding layer provides a small amount of conduction underlying the active region and thus prevents the build up of the negative charge layer in the buffer layer. Further, the shielding layer isolates the active layer from the substrate and buffer layer thus preventing out-diffusion of chromium from said layers into the active layer, and, the decrease in electron mobility and loss of power, generally associated with such out-diffusions.

BRIEF DESCRIPTION OF THE DRAWINGS

The foregoing features of the invention as well as the invention itself may be more fully understood from the following description of the drawings in which.

DESCRIPTION OF THE PREFERRED EMBODIMENT

Figure 1:
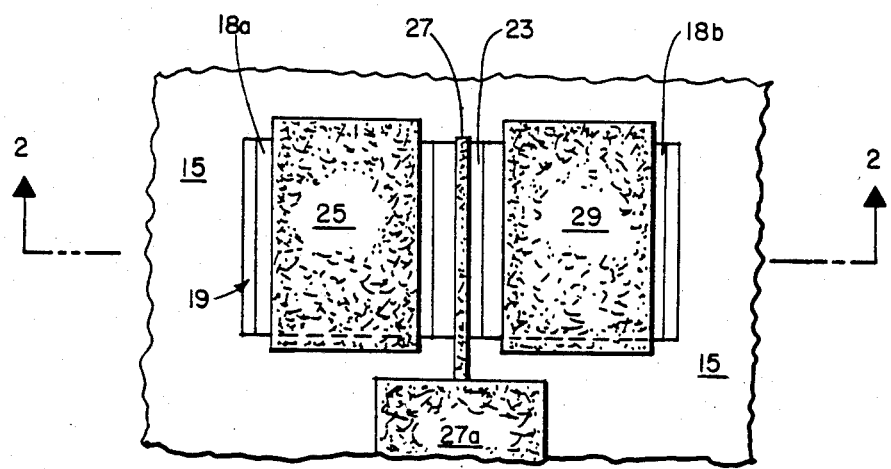
FIG. 1 is a plan view of a field effect transistor.
Figure 2:
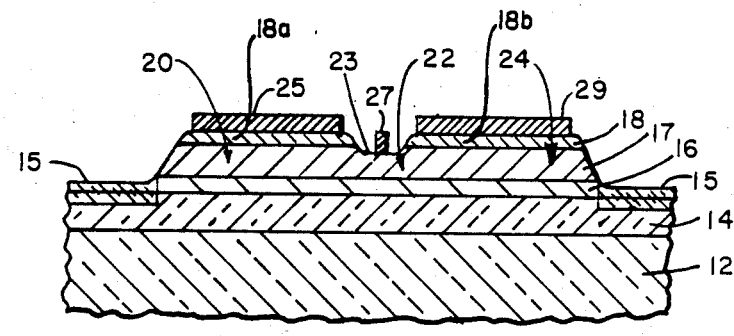
FIG. 2 is a cross-sectional view of the field effect transistor of FIG. 1 taken along lines 2—2 showing a shielding layer in accordance with the present invention.

Referring now to FIGS. 1 and 2, a field effect transistor (FET) 10 is shown to include a substrate 12 here comprising gallium arsenide or any other Group III-V semiconductor material system and a plurality of sequentially vapor-phase epitaxial deposited layers 14, 16, 17 and 18, here also of gallium arsenide or other Group III-V semiconductor material system, which are formed on a first surface of such substrate 12. Layer 14 is here a high resistivity buffer layer comprising a chromium doped compensated semiconductor material fabricated in accordance with techniques well known in the art. A mesa region 19 is here provided by etching layers 16, 17 and 18 using techniques well known in the art and is used to provide isolation between the different field effect transistors which may be formed on the common substrate 12. Epitaxial layer 16 is here an N$^-$ shielding layer having a dopant density, here electron density in the range of $10^{14} - 3 \times 10^{15}$ carriers/cm$^3$. Any group IV element may be used to dope epitaxial layer 16, here silicon is preferred. Shielding layer 16 typically has a thickness of 0.2 to 2 microns with 1 micron being a preferred thickness. Shielding layer 16 here exhibits a small amount of DC and radio frequency (rf) conduction and is provided between buffer layer 14 and the active layer 17 to shield the active layer 18 from the deleterious effects resulting from the doped buffer layer 14, such as the fixed net negative charge layer caused by the ionization of the chromium dopant as well out-diffusion of chromium into the active layer 17 generally associated with prior art devices. Layer 17 is here an N-type active layer having an electron concentration typically in the order of $10^{17}$ carriers/cm$^3$, as is known in the art. Upon active layer 17 is provided a highly conductive contact layer 18, patterned to provide regions 18a and 18b, which are used to provide drain and source regions 20, 24 for the field effect transistor 10, as is also known in the art. Provided on the upper surfaces of mesa 19 in respective drain and source regions 18a and 18b are respective drain and source electrodes 25 and 29. Drain and source electrodes 25 and 29 are provided over the regions 18a and 18b of mesa 19 providing ohmic contacts between drain and source electrodes 25 and 29 and regions 18a and 18b. A recess portion 23 of active layer 18 is provided using techniques well known in the art to form a gate region 22 on active layer 17. Disposed in recess 23 on active layer 18 is a thin gate electrode 27 formed in Schottky barrier contact with active region 17. The thin gate electrode 27 is thus formed in the region 23 and is connected to a gate pad 27a, as shown in FIG. 1. Optionally, oxygen or hydrogen implants or other suitable ions are implanted through peripheral portions 15 of buffer layer 16 to provide additional peripheral isolation for field effect transistor 10.

By providing the thin semiconductor region 16 between the buffer layer 14 and active layer 17, extending in a region underlying drain, source and gate regions of the field effect transistor 10, a small amount of conduction underlying source and drain regions 20, 24 is provided in the shielding layer 16 of the field effect transistor 10. This small amount of conduction in the shielding layer 16 prevents the build up of the fixed negative charge layer in the buffer layer 14. Since the shielding layer 16 is provided substantially free of the so-called deep acceptor levels generally associated with buffer layer doping, there is no ionization of such deep acceptor levels in the presence of an RF field at the buffer layer/active layer interface, as generally occurs in devices without the shielding layer 16. Improved RF performance is thus provided by the field effect transistor 10 having the shielding layer 16 since the layer of negative charge which forms in the buffer layer 14 in response to ionization of deep acceptor levels in the buffer layer 14 is eliminated by the presence of a small amount of conduction in the shielding layer 16. Further, shielding layer 16 being substantially deplete of chromium will isolate the active layer 17 from out-diffusion of chromium from the buffer layer 14 and substrate 12. By preventing or substantially reducing the out-diffusion of chromium from substrate 12 and buffer layer 14 into the active layer 17 of the field effect transistor 10, the decrease in electron mobility and the loss in r.f. power generally associated with such out-diffusion is eliminated.

Alternative methods may be used in addition to the epitaxial growth, described above, to form the N$^-$ shielding layer 16. For example, the buffer layer 14 may be simply grown thick enough so that the normal N type background donor doping dominates over the deep acceptors diffusing from the substrate. Further, a deep ion implant of a suitable donor species could also be used to provide the shielding layer 16.

Having described a preferred embodiment of the invention, it will now be apparent to one of skill in the art that other embodiments incorporating its concept may be used. It should be noted that a preferred application for a field effect transistor employing the shielding layer is to amplify a radio frequency signal. However such a field effect transistor could also be used in switching applications under specified conditions particularly where the conduction underlying the above region is relatively small so as to allow pinch-off of the channel. It is felt, therefore that this invention should not be restricted to the disclosed embodiment but rather should be limited only by the spirit and scope of the appended claims.

What is claimed is:

1. A field effect transistor having gate, drain and source electrodes comprising:
   a substrate comprising gallium arsenide, said substrate having crystal defects which provide electron and hole traps;
   a doped buffer layer disposed over said substrate and comprising a gallium arsenide crystal layer having acceptor energy levels intermediate valence and conduction bands of said crystal layer provided by doping said crystalline layer with chromium to compensate for donor energy levels provided by dopants incorporated into said crystalline layer to provide said layer having a predetermined resistivity characteristic;
   a shielding layer disposed over the doped buffer layer comprising a layer of gallium arsenide over said buffer layer having an electron concentration substantially in the range of $10^{14}$ to $3 \times 10^{15}$ electrons/cm$^3$;
   an active layer comprising gallium arsenide having a dopant concentration of about $10^{17}$ electron/cm$^3$, disposed over said shielding layer;
   a gate electrode disposed in Schottky-barrier contact with a portion of said active layer;
   a contact layer disposed over portion of said active layer and comprising a highly doped layer of gallium arsenide selected to provide ohmic contact region for drain and source electrodes; and
   wherein the electron concentration in the shielding layer provides a small predetermined conduction in said shielding layer to isolate the active layer from a net ionization of said chromium dopant in the buffer layer provided in response to a current flux between drain and source electrodes and from a net ionization of the electron and hole traps provided in said substrate.

2. The transistor of claim 1 wherein the shielding layer is doped with a Group IV element.

3. The transistor of claim 1 wherein said shielding layer has a thickness in the range of 0.2 to 2.0 microns.

4. The transistor of claim 2 wherein the shielding layer is doped with silicon.

5. The transistor of claim 3 wherein the shielding layer is doped with silicon.